(12) United States Patent
Sakai et al.

(10) Patent No.: US 7,045,462 B2
(45) Date of Patent: May 16, 2006

(54) METHOD FOR FABRICATING A PATTERN AND METHOD FOR MANUFACTURING A SEMICONDUCTOR DEVICE

(75) Inventors: Takayuki Sakai, Chofu (JP); Tokuhisa Ohiwa, Kawasaki (JP); Masanobu Kibe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 214 days.

(21) Appl. No.: 10/395,065

(22) Filed: Mar. 25, 2003

(65) Prior Publication Data

US 2004/0058533 A1 Mar. 25, 2004

(30) Foreign Application Priority Data

Sep. 24, 2002 (JP) .................................... P2002-278089

(51) Int. Cl.
*H01L 21/302* (2006.01)

(52) U.S. Cl. ..................... 438/689; 438/706; 438/725

(58) Field of Classification Search ................. 438/689, 438/706, 725; 385/37; 359/566, 569
See application file for complete search history.

(56) References Cited

U.S. PATENT DOCUMENTS

| | | | |
|---|---|---|---|
| 6,423,457 B1 | | 7/2002 | Bell |
| 6,483,965 B1 | * | 11/2002 | Napier et al. .................. 385/37 |
| 6,767,594 B1 | * | 7/2004 | Miroshin et al. ........... 428/1.31 |
| 2004/0058533 A1 | * | 3/2004 | Sakai et al. .................. 438/689 |
| 2004/0179202 A1 | * | 9/2004 | Sezginer ...................... 356/451 |

FOREIGN PATENT DOCUMENTS

| | | |
|---|---|---|
| JP | 2000-100797 | 4/2000 |
| JP | 2002-93870 | 3/2002 |
| JP | 2002-093870 | * 3/2002 |
| JP | 2002-261043 | 9/2002 |

OTHER PUBLICATIONS

Kikuta, "Subwavelength Diffraction Gratings," O Plus E (1999), 21:543-550.
Rytov, "Electromagnetic Properties of a Finely Stratified Medium," Soviet Physics JETP (May 1956), 2:466-475.
First Office Action issued by Chinese Patent Office on Jun. 10, 2005, in Chinese Patent Application No. 03134814.9.

* cited by examiner

*Primary Examiner*—Laura M. Schillinger
(74) *Attorney, Agent, or Firm*—Finnegan, Henderson, Farabow, Garrett & Dunner, L.L.P.

(57) ABSTRACT

A method for fabricating a pattern, includes: delineating a mask pattern on at least a portion of an underlying layer; etching a portion of the mask pattern; irradiating an incident light on the mask pattern to which the etching is performed and detecting a reflected light produced by reflecting the incident light after the incident light is transmitted through the mask pattern; obtaining a reflected interference spectrum; and calculating a pattern width of the mask pattern using data of the reflected interference spectrum, the reflected interference spectrum being in a wavelength range of not less than two times a pitch of the mask pattern.

20 Claims, 7 Drawing Sheets

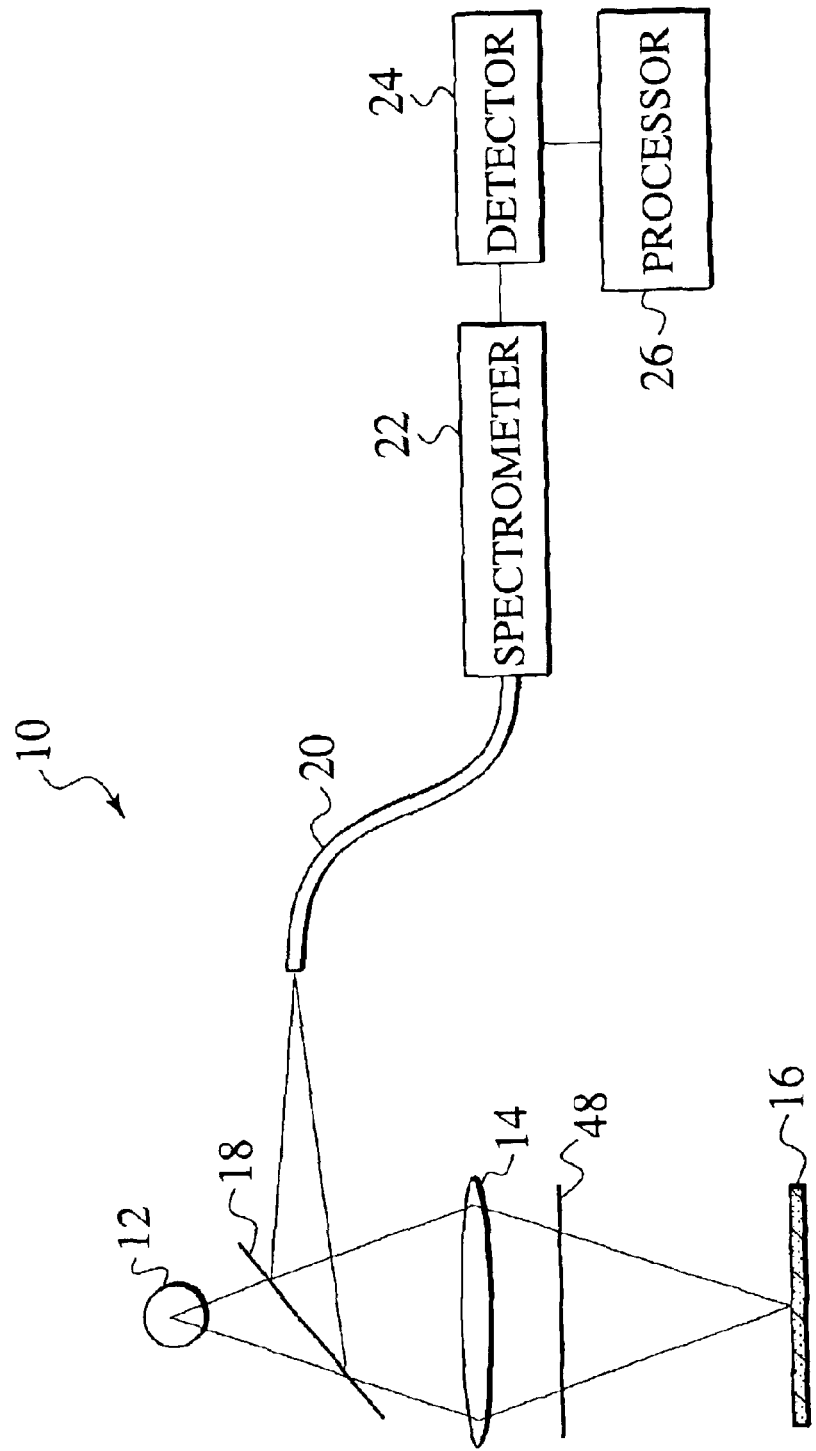

METHOD FOR FABRICATING A PATTERN AND METHOD FOR MANUFACTURING A SEMICONDUCTOR DEVICE

CROSS REFERENCE TO RELATED APPLICATIONS

This application is based upon and claims the benefit of priority from prior Japanese Patent Application P2002-278089 filed on Sep. 24, 2002; the entire contents of which are incorporated by reference herein.

BACKGROUND OF THE INVENTION

1. Field of the Invention

The present invention relates to a method for fabricating a pattern and further relates to a method for manufacturing a semiconductor device using the method for fabricating a pattern.

2. Description of the Related Art

A gate structure of a metal oxide semiconductor (MOS) transistor is formed by the following process steps. First, for example, a thin gate oxide film is formed on a p-type silicon (Si) substrate, and a polysilicon thin film is deposited on the gate oxide film. Then, a photoresist is coated on the polysilicon thin film and is patterned using a photolithography technique to form a gate mask pattern. Thereafter, the polysilicon thin film and the gate oxide film are selectively etched using the gate mask pattern by means of reactive ion etching (RIE), thereby forming a gate structure. Since the RIE is a directional etching, the polysilicon thin film and the gate oxide film are etched in a vertical direction relative to an etching mask and therefore, the gate structure is formed to have the same pattern dimensions as the gate mask pattern.

However, in accordance with recent higher integration and higher speed operation of a semiconductor device, a shorter gate length is increasingly in demanded and therefore, the above-described photolithography technique alone cannot address requirements for achieving a finer pattern because of resolution limitation due to the wavelength of a light source of an aligner. Therefore, a method for fabricating a pattern has been employed in which a mask pattern is first fabricated using the photolithography technique and then the mask pattern is etched by an isotropic etching process using a reactive gas species generated by a plasma or the like so as to reduce a pattern width. However, in a process to reduce the pattern width of the mask pattern, typically, the pattern width is adjusted by controlling an etching time of the isotropic etching process. In more detail, the etching rate of the isotropic etching process was previously calculated based on several preliminary experiments, and then a reduced width of the mask pattern has been determined by controlling an etching time provided from the etching rate. Accordingly, unexpected variations in etching conditions in the reduction process of the mask pattern decreases controllability and reproducibility of the reduced width of the mask pattern, which results in variations in the pattern width of the gate structure.

Furthermore, to measure a pattern width of a fine mask pattern, a Scanning Electron Microscope (SEM) is typically used. When performing an SEM measurement, a semiconductor substrate needs to be loaded into a vacuum chamber of the SEM, which means that the SEM measurement is not a simple task. Moreover, when performing an SEM measurement, high-energy beams are used and, therefore, the mask pattern is damaged. In view of the above described problems, it is desirable to perform measurement of the pattern width by using an optical method.

As described above, in the reduction process of the mask pattern for a gate structure and the like, the reduced width of the mask pattern is adjusted by controlling the etching time. Therefore, it is difficult to improve controllability and reproducibility of the reduced width or productivity of the reduction process of the mask pattern.

SUMMARY OF THE INVENTION

A first aspect of the present invention inheres in a method for fabricating a pattern and includes: delineating a mask pattern on at least a portion of an underlying layer; etching a portion of the mask pattern; irradiating an incident light on the mask pattern to which the etching is performed and detecting a reflected light produced by reflecting the incident light after the incident light is transmitted through the mask pattern; obtaining a reflected interference spectrum; and calculating a pattern width of the mask pattern using data of the reflected interference spectrum, the reflected interference spectrum being in a wavelength range of not less than two times a pitch of the mask pattern.

A second aspect of the present invention inheres in a method for manufacturing a semiconductor device and includes: forming an underlying layer on a semiconductor substrate; delineating a mask pattern on the underlying layer; etching a portion of the mask pattern; irradiating an incident light on the mask pattern to which the etching is performed and detecting a reflected light produced by reflecting the incident light after the incident light is transmitted through the mask pattern; obtaining a reflected interference spectrum; calculating a pattern width of the mask pattern using data of the reflected interference spectrum, the reflected interference spectrum being in a wavelength range of not less than two times a pitch of the mask pattern; and selectively processing the underlying layer using the mask pattern, the mask pattern being etched to have a desired pattern width.

BRIEF DESCRIPTION OF DRAWINGS

FIG. 1 illustrates a block diagram of a pattern width measurement system according to a first embodiment of the present invention;

DETAILED DESCRIPTION OF THE INVENTION

Figure 2A:
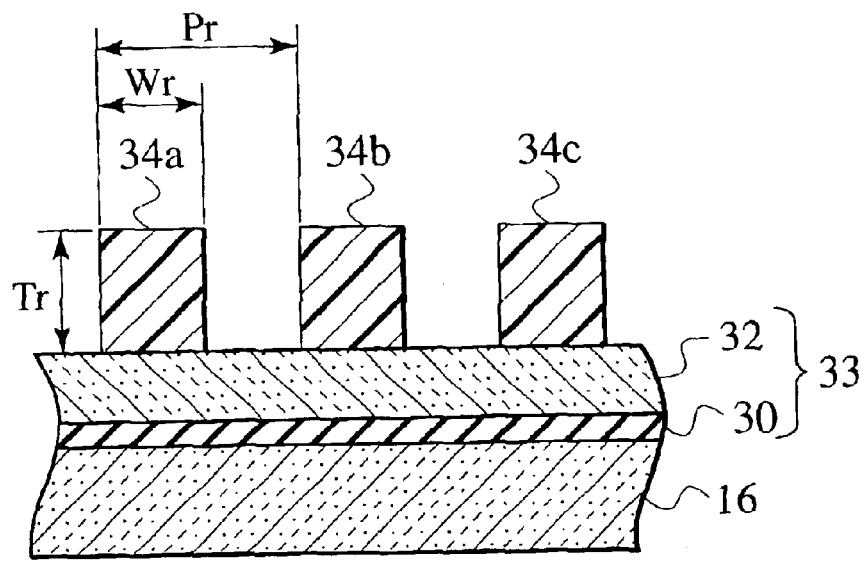
FIGS. 2A and 2B illustrate cross sectional views of an exemplified semiconductor substrate used to explain a method for fabricating a pattern according to the first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

As shown in FIG. 1, a pattern width measurement system 10 according to a first embodiment of the present invention includes: a light source 12 using a tungsten lamp having a continuous spectral distribution with wavelengths ranging from the visible to the infrared; a lens 14 condensing an incident light from the light source 12 and irradiating the condensed incident light on a semiconductor substrate 16 which has a mask pattern formed with a resist film pattern and the like on a surface thereof, so as to substantially allow the condensed incident light to be transmitted through the mask pattern; a polarizer 48 interposed between the lens 14 and the semiconductor substrate 16 so as to provide a polarized light from the incident light; a beam splitter 18 for distributing a reflected light from the semiconductor substrate 16; an optical fiber 20 for introducing the reflected light distributed from the beam splitter 18; a spectrometer 22 separating the reflected light introduced from the optical fiber 20 into spectral components; a detector 24 detecting an intensity of the reflected light at each of the separated component wavelengths and outputting a reflected interference spectrum; and a processor 26 calculating a pattern width of the mask pattern using the reflected interference spectrum.

Mask patterns in the first embodiment of the present invention, for example, is a line and space (L/S) configuration delineated using a resist film on at least a portion of an underlying layer on the semiconductor substrate 16. The L/S configuration can be regarded as a composite dielectric layer in which lines of solid resist films are interspersed with vacuum regions disposed at the space regions. It should be noted the incident light is polarized approximately in parallel in a longitudinal direction of the L/S configuration by the polarizer 48. The L/S configuration of the mask patterns irradiated by the polarized incident light can be assumed to be a virtual composite dielectric layer having an average effective refractive index calculated by a mixed ratio of the refractive index of the resist films and that of the vacuum regions, when the incident light having a wavelength longer than two times a pitch of the L/S configuration is irradiated (refer to H. Kikuta, O Plus E. Vol. 21, No. 5, p. 543). Accordingly, a pattern width of the mask patterns can be calculated for a multilevel film configuration including the virtual composite dielectric layer and the underlying real layer, by fitting the measured reflected interference spectrum to a theoretical spectrum, using the mixed ratio of the virtual composite dielectric layer and a thickness of the mask pattern as parameters. The processor 26 performs the calculation of a pattern width. Functions of the processor 26 are achieved by software installed in a computer, a program converted to a hardware implementation or the like.

Figure 2B:
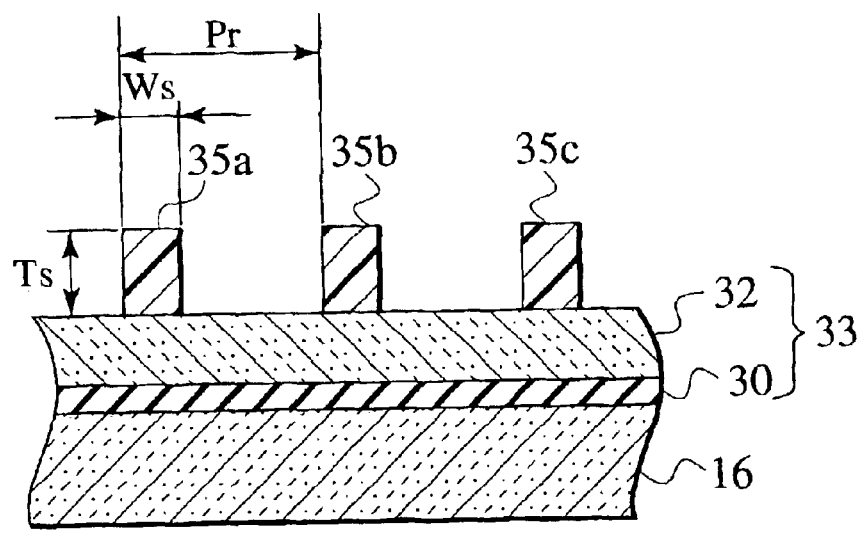

A method for fabricating a pattern according to the first embodiment of the present invention will be explained with reference to FIGS. 2A and 2B. As shown in FIG. 2A, an insulating film 30 such as a silicon oxide ($SiO_2$) film, and a conductive film 32 such as a polysilicon film, are sequentially deposited so as to form a composite underlying layer 33 on a surface of the semiconductor substrate 16 made of silicon (Si) and the like. Resist mask patterns 34a to 34c (mask patterns) are delineated on the conductive film 32. In the first embodiment of the present invention, thicknesses of the insulating film 30 and the conductive film 32 are 2 nm and 175 nm, respectively. Additionally, dimensions of the mask patterns 34a to 34c are: a pattern width Wr of 110 nm, a pitch Pr of 200 nm and a thickness Tr of 300 nm.

The semiconductor substrate 16 shown in FIG. 2A is loaded in a plasma etching apparatus. Then, a reduction process of the mask patterns 34a to 34c is performed using a plasma etching process. An oxygen ($O_2$) gas is used for the plasma etching. However, it is needless to say that any gas, which provides selective etching of the mask patterns 34a to 34c to the composite underlying layer 33, may be used.

Measurement of a pattern width is performed during the reduction process of the mask patterns 34a to 34c. More specifically, the semiconductor substrate 16 is unloaded from the plasma etching apparatus and then is placed into the pattern width measurement system. An incident light from the light source 12 is condensed and polarized through the lens 14 and the polarizer 48, and then irradiates the surface of the semiconductor substrate 16. The interference light reflected at the semiconductor substrate 16 travels through the beam splitter 18 and the optical fiber 20, and then is introduced into the spectrometer 22. The spectral components of the reflected interference light separated by the spectrometer 22 are transmitted to the detector 24, and the detector 24 detects spectral intensity of the reflected interference light at each of the wavelengths. The reflected interference spectrum obtained as a result of detection by the detector 24, is read out to the processor 26, and then the processor 26 calculates the pattern width Wr of the mask patterns 34a to 34c on the semiconductor substrate 16.

Figure 3:
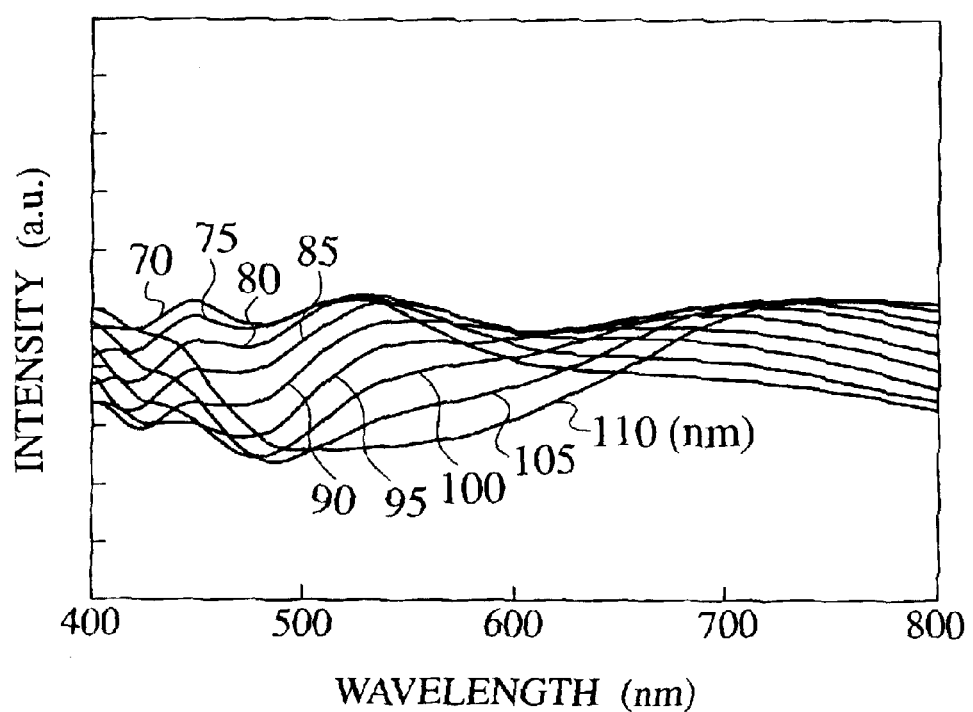
FIG. 3 is a graph showing reflected interference spectra of the semiconductor substrate provided by using the pattern width measurement system according to the first embodiment of the present invention.

When measuring the reflected interference spectrum in a wavelength range of 400 to 800 nm, as the pattern width Wr of the mask patterns 34a to 34c is reduced, the profile of the reflected interference spectrum varies, as shown in FIG. 3. In FIG. 3, the spectral intensity of the reflected interference light is measured at each of regular time intervals during the plasma etching process. For each of the regular time intervals of the plasma etching, the pattern width Wr is reduced by 5 nm.

It should be noted that whereas the pitch Pr of the L/S configuration for the mask patterns 34a to 34c is 200 nm, the wavelength of the reflected interference light used for measurement is in a range of 400 to 800 nm, i.e., larger than two times the pitch Pr. Accordingly, the L/S configuration of the mask patterns 34a to 34c can be assumed to be a uniform mixed dielectric layer having an average effective refractive index $n_p$ determined by a mixed ratio of the L/S configuration.

The mixed ratio t of the L/S configuration is represented by a volume ratio of the resist film, which corresponds to line portions of the mask patterns 34a to 34c in the virtual composite dielectric layer. The effective refractive index $n_p$ of the mixed dielectric layer is represented, using the refractive index of the vacuum being equal to 1, by the following:

$$n_p = \{t^* n(\lambda)^2 + (1-t)\}^{1/2} \tag{1}$$

where $n(\lambda)$ is a refractive index of the resist film at a wavelength $\lambda$. Additionally, the pattern width Wr is deter mined using the mixed ratio t and the pitch Pr of the L/S configuration by the following:

$$Wr = t * Pr. \quad (2)$$

Accordingly, for the mixed dielectric layer assumed to be a single homogeneous dielectric layer having the effective refractive index $n_p$, fitting of the measured reflected interference spectrum to the theoretical spectrum is performed using the mixed ratio t and the thickness Tr of the mask patterns 34a to 34c as parameters. Using the equation (2) with the mixed ratio t determined by the fitting, the pattern width Wr of each of the mask patterns is calculated.

As described above, an end point of plasma etching in the reduction process of the mask patterns 34a to 34c is determined by the results calculated by the processor 26. By the reduction process, the mask patterns 34a to 34c having a pattern width Wr of 110 nm and a thickness Tr of 300 nm, are reduced and change to reduced mask patterns 35a to 35c having a pattern width Ws and a thickness Ts, respectively, as shown in FIG. 2B. Finally, in the reduced mask patterns 35a to 35c, the pattern width Ws is reduced to 70 nm, while the thickness Ts is reduced to 200 nm. It should be noted the pitch Pr does not change even in the reduced mask patterns 35a to 35c.

In the method for fabricating a pattern according to the first embodiment of the present invention, the reduction of the mask patterns 34a to 34c may be highly controlled and reproduced by optically measuring the pattern width Wr of the mask patterns 34a to 34c.

In the first embodiment of the present invention, the plasma etching in the reduction process of the mask patterns 34a to 34c is repeatedly performed at regular time intervals. Although it is possible to reduce a pattern width which can be highly controlled and reproduced, the above-mentioned method is time consuming. Therefore, the following procedure may be used in an actual reduction process of the mask pattern. First, for example, about 80% of the target reduced width of the mask pattern is etched away in a time by the plasma etching process in anticipation of an occurrence in variations in etching conditions, and then the pattern width is finely adjusted using the method for fabricating a pattern according to the first embodiment.

Figure 4:
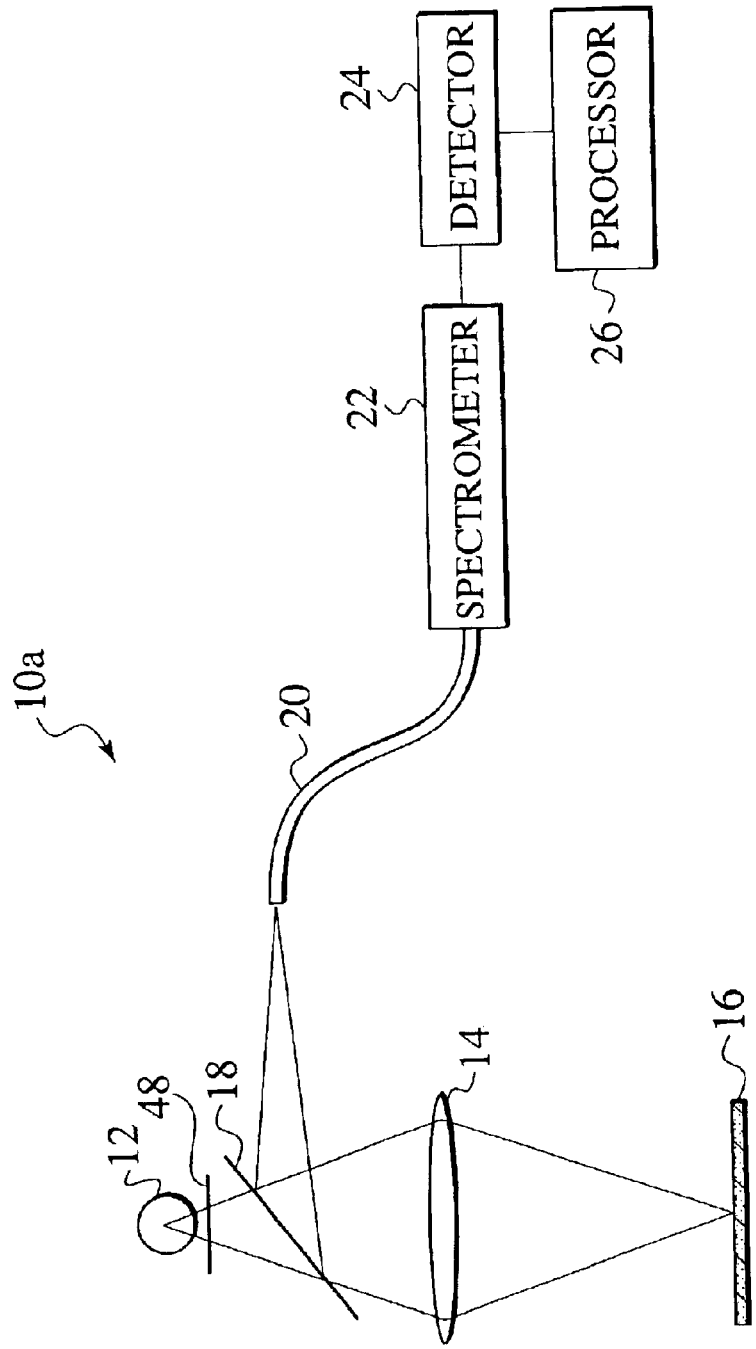
FIG. 4 illustrates a block diagram of other pattern width measurement system according to the first embodiment of the present invention.
Figure 5:
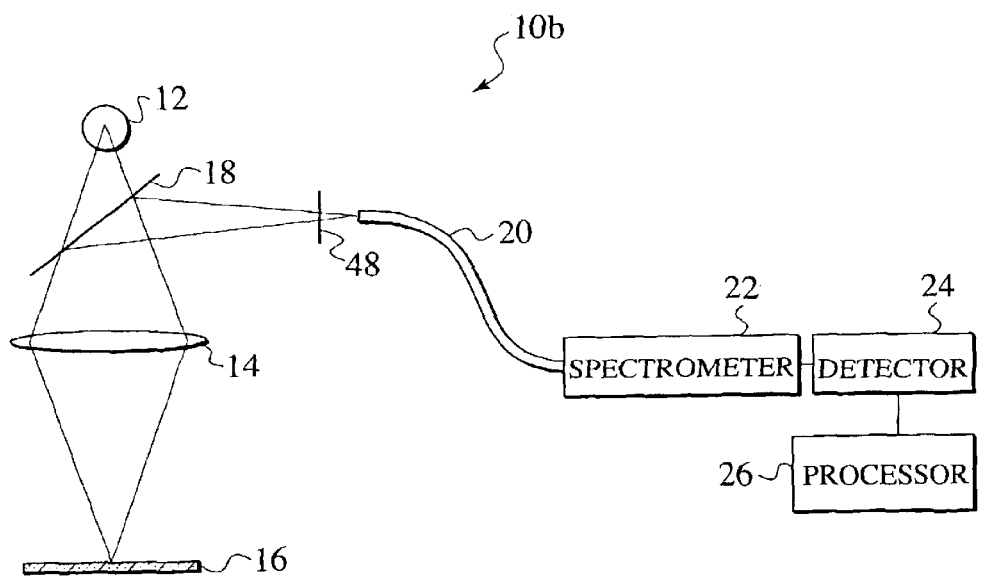
FIG. 5 illustrates a block diagram of another pattern width measurement system according to the first embodiment of the present invention.
Figure 6:
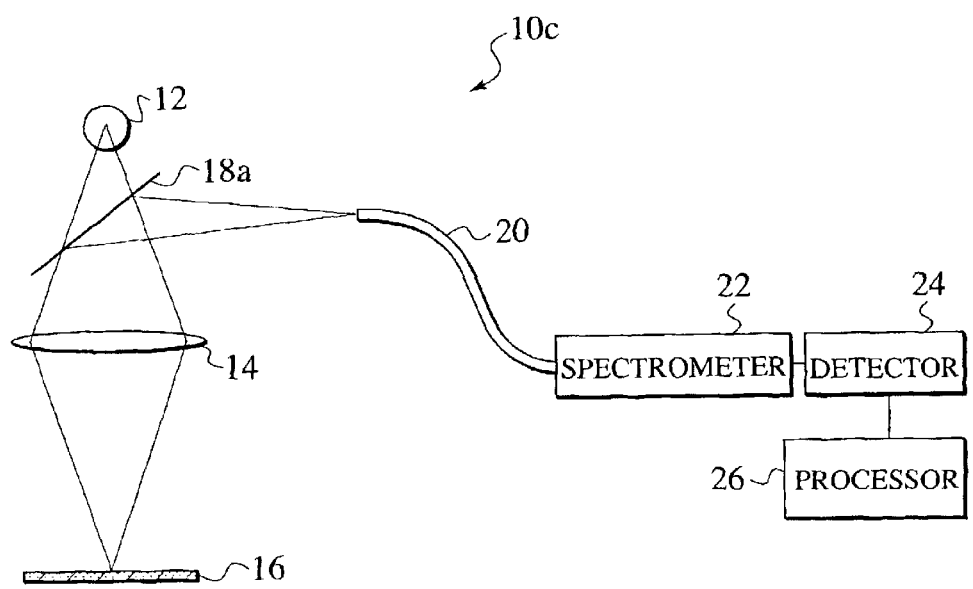
FIG. 6 illustrates a block diagram of yet another pattern width measurement system according to the first embodiment of the present invention.

Moreover, in the pattern width measurement system 10, although the polarizer 48 is disposed between the lens 14 and the semiconductor substrate 16, the polarizer 48 may be disposed at other locations. For example, the polarizer 48 may be disposed between the beam splitter 18 and the lens 14. Furthermore, as can be seen in the configuration of a pattern width measurement system 10a shown in FIG. 4, the polarizer 48 may be disposed between the light source 12 and the beam splitter 18 so as not to allow reflected light from the semiconductor substrate 16 to be transmitted through the polarizer 48. Alternatively, as shown in FIG. 5, a pattern width measurement system 10b is not configured to make the incident light on the semiconductor substrate 16 polarized, but, for example, may be configured to position the polarizer 48 between the beam splitter 18 and the optical fiber 20 in order to detect only the desired polarized components of the reflected light. Additionally, in the configuration of a pattern width measurement system 10c, as shown in FIG. 6, instead of the beam splitter 18, a polarized beam splitter 18a may be used to reflect only the desired polarized components of the reflected light to the optical fiber 20.

Moreover, in the first embodiment of the present invention, the incident light is polarized approximately in parallel with the longitudinal direction along the L/S configuration. However, the incident light may be polarized in a direction approximately orthogonal to the longitudinal direction along the L/S configuration. In this case, an effective refractive index $n_v$ of the mixed dielectric layer is represented by the following:

$$n_v \{1/[t/n(\lambda)^2 + (1-t)]\}^{1/2} \quad (3)$$

Furthermore, in the first embodiment of the present invention, the pattern width Wr and the pitch Pr of each of the mask patterns 34a to 34c are configured to be equal to one another. However, the pattern width Wr and the pitch Pr of each of the mask patterns 34a to 34c may be different from one another. In this case, a wavelength not less than two times the maximum pitch Pr of the mask patterns 34a to 34c may be used.

Modification of the First Embodiment

In a method for fabricating a pattern according to a modification of the first embodiment of the present invention, a complicated theoretical spectrum is not used. Variations in a measured reflected interference spectrum due to a variation in a pattern width and a thickness of the mask patterns 34a to 34c, is defined in numerical terms. Then, using the numerical values of the variations in the reflected interference spectrum, the pattern width of the mask patterns 34a to 34c are calculated. The configuration of the modification of the first embodiment other than the above-described configuration is similar to that of the first embodiment and therefore, the repeated explanation thereof is omitted.

The measured reflected interference spectrum, for example, varies as is shown in FIG. 3. To define the changes in the reflected interference spectrum in the numerical values, for example, a method using the wavelength dependence of the minimum value of the spectrum can be employed. Alternatively, a method using a difference between spectral intensities of the reflected interference light can be employed to define the above-described change in numerical terms. In the modification of the first embodiment, although a method using a difference between the spectral intensities of the reflected interference light will be explained as an example, it is needless to say that a method using the wavelength dependence of the minimum value of the spectrum and the like can be employed.

Figure 7:
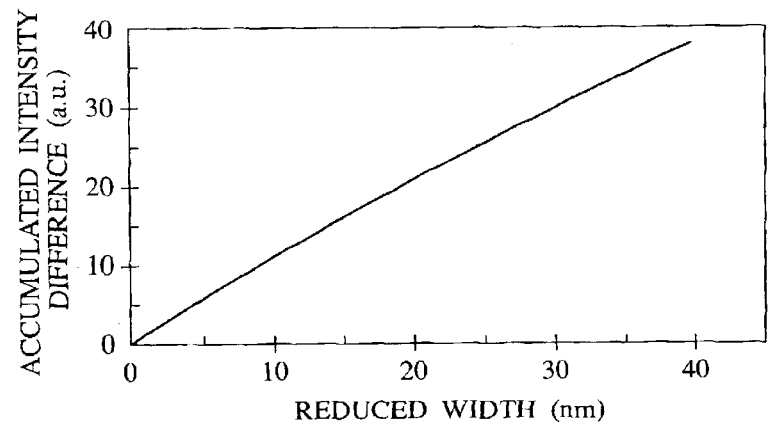
FIG. 7 is a graph showing a relation between a reduced width difference and an accumulated intensity difference with the reflected interference spectra of the semiconductor substrate provided by using the pattern width measurement system according to the first embodiment of the present invention.

When using a difference between the spectral intensities of the reflected interference light at one wavelength, the pattern width cannot be determined in some cases since the reflected interference spectrum at a wavelength does not necessarily change in a monotone manner as shown in FIG. 3. In the modification of the first embodiment, a difference of spectral intensities between a measured reflected interference light and a reflected interference light just before the measurement is determined over the measured wavelengths of 400 to 800 nm, and the differences are summed from the initial value over the entire wavelengths to provide accumulated intensity differences. As shown in FIG. 7, the accumulated intensity difference changes linearly with a reduced width (Wr−Ws) of the reduced mask patterns 35a to 35c. Data indicative of the numerical values obtained through the above-described procedure is stored in the processor 26 of the pattern width measurement system 10. Then, based on the reflected interference spectrum measured in the reduction process of the mask pattern, the processor 26 calculates a corresponding accumulated intensity difference. Based on the accumulated intensity difference thus calculated, a pattern width can be determined in a simplified and highly accurate manner by referring to the data indicative of the numerical values.

According to the modification of the first embodiment of the present invention, the pattern width of each of the mask patterns can be reduced in a simplified, highly controlled and reproducible manner while optically measuring the pattern width of each of the mask patterns. It should be noted when defining change in the measured reflected interference spectrum in numerical terms and referring to the data indicative of the numerical values in accordance with the above-described procedure, it is apparent that in addition to the pattern width of each of the mask patterns, the thickness of a resist can be calculated. Therefore, in addition, the method employed in the modification of the first embodiment can be widely applied to the technical fields that perform general optical measurement of dimensions of object such as thickness, depth, and the like, based on the reflected interference spectrum, and accordingly the method makes it possible to omit the operation for fitting to a complicated theoretical spectrum.

Second Embodiment

Figure 8:
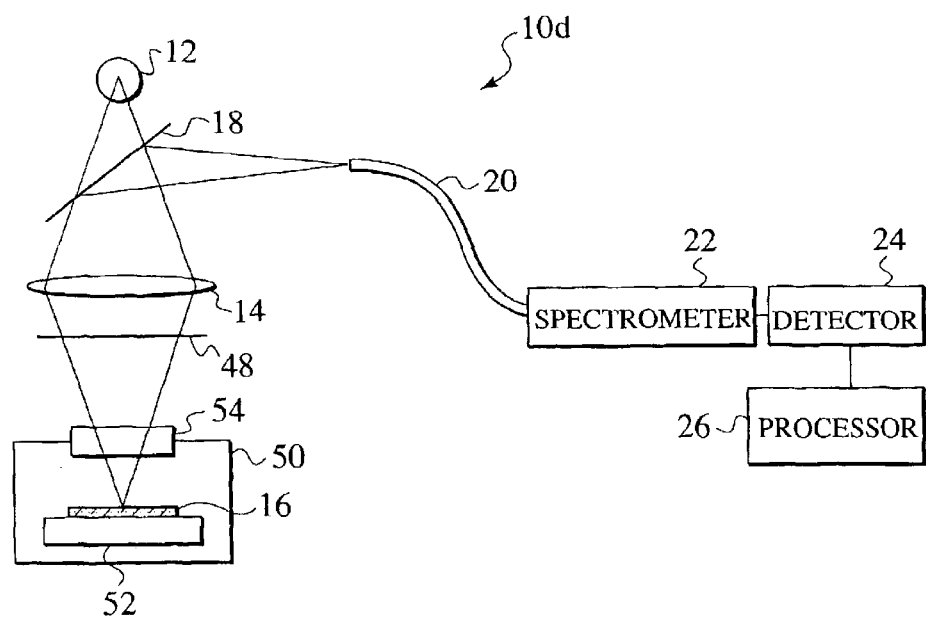
FIG. 8 illustrates a block diagram of a pattern width measurement system according to a second embodiment of the present invention.

As shown in FIG. 8, a pattern width measurement system 10d according to a second embodiment of the present invention is configured to have the aforementioned pattern width measurement system 10 according to the first embodiment provided in a plasma etching apparatus. The plasma etching apparatus has a lower electrode plate 52 disposed within a chamber 50 used to perform a reduction process of a mask pattern. A semiconductor substrate 16 to be etched is disposed on the upper surface of the lower electrode plate 52. For example, a measurement window 54 made of silica glass is located in an upper portion of the chamber 50. An incident light on the semiconductor substrate 16 is introduced through the measurement window 54 into the chamber 50 and a reflected light from the semiconductor substrate 16 is retrieved from the chamber 50.

Installing the pattern width measurement system 10d in the plasma etching apparatus allows the plasma etching apparatus to perform an "in-situ" measurement of a reduced width of the mask pattern in the reduction process of the mask pattern. Furthermore, real-time feedback of the results obtained by measuring the pattern width using the pattern width measurement system 10d to the plasma etching apparatus allows the plasma etching apparatus to control plasma etching with high accuracy in the reduction process of the mask pattern. Particularly, the above-described procedure is preferably used to form a fine gate structure through the reduction process of the mask pattern.

A difference between the method for fabricating a pattern according to the second embodiment of the present invention and the method according to the first embodiment is that, in the method according to the second embodiment, the pattern width measurement system 10d is installed in the plasma etching apparatus and the reduction process of the mask pattern is controllably performed while performing an in-situ measurement of a pattern width during the plasma etching in the reduction process of the mask pattern. The configuration of the second embodiment other than the above-described configuration is similar to that of the first embodiment and therefore, the repeated explanation thereof is omitted.

Furthermore, as shown in FIG. 8, although the pattern width measurement system 10d is described as an example configured to have provided therein the pattern width measurement system 10 according to the first embodiment, needless to say, instead of the pattern width measurement system 10, any one of the measurement systems for measuring a pattern width 10a to 10c according to the first embodiment may be employed.

The formation of a gate structure using the method for fabricating a pattern according to the second embodiment of the present invention will be explained with reference to FIGS. 9A through 9C.

(a) First, a semiconductor substrate 16 made of silicon (Si) and the like, having a composite underlying layer 63 formed on a surface thereof is prepared. As shown in FIG. 9A, an insulating film 60 of $SiO_2$ film and the like and a conductive film 62 of a polysilicon film and the like, are deposited in the above order on a surface of the semiconductor substrate 16 so as to implement the composite underlying film 63. A gate mask pattern 74 and monitor mask patterns 64a to 64c are delineated on the conductive film 62 by a photolithography technique. It should be noted the insulating film 60 is a silicon oxide film having a thickness of 2 nm, and the conductive film 62 is a polysilicon film having a thickness of 175 nm. The gate mask pattern 74 is an isolated resist pattern provided to form a gate structure. The gate mask pattern 74 is formed to have a pattern width of 110 nm and a thickness of 300 nm. On the other hand, the monitor mask patterns 64a to 64c having a L/S configuration and each of the monitor mask patterns 64a to 64c is formed to have a pattern width Wr of 110 nm, a pitch Pr of 200 nm and a thickness Tr of 300 nm.

Figure 9A:
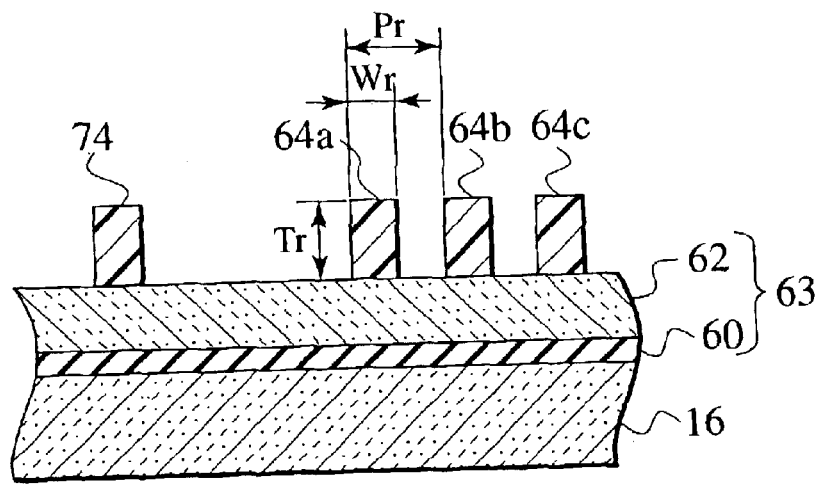
FIGS. 9A through 9C illustrate cross sectional views explaining a fabrication process for a gate structure according to the second embodiment of the present invention.
Figure 9B:
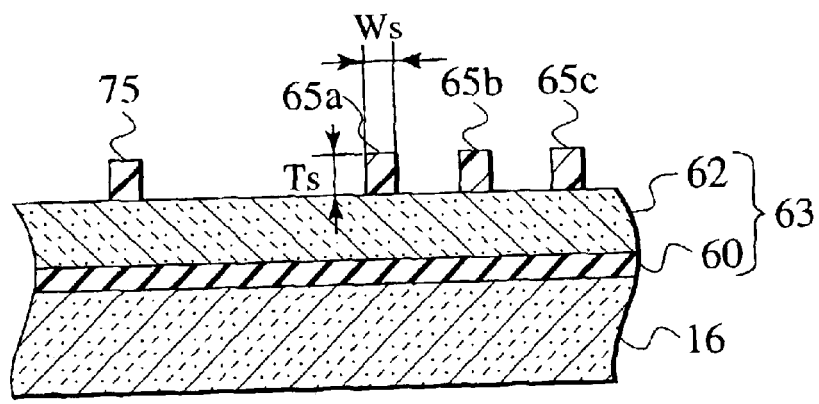
Figure 9C:
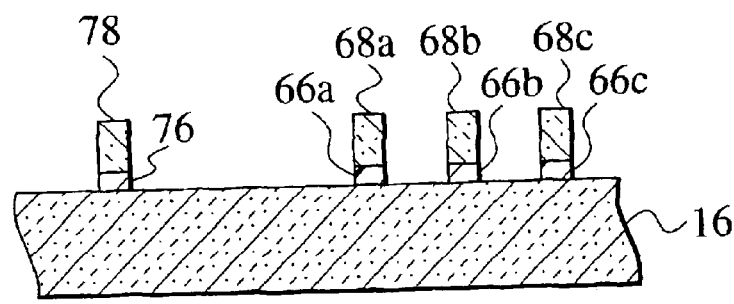

(b) The semiconductor substrate 16 shown in FIG. 9A is placed on the lower electrode plate 52 within the chamber 50 as shown in FIG. 8. Then, the chamber 50 is evacuated. Thereafter, the reduction process of the mask pattern is performed by introducing an etching gas into the chamber and high frequency power is supplied to carry out a plasma etching process. A light is irradiated onto the monitor mask patterns 64a to 64c by means of the pattern width measurement system 10d immediately prior to starting the plasma etching, and an initial reflected interference spectrum is measured in a wavelength range of 400 to 800 nm. Subsequently, while the reflected interference spectrum is measured, the reduction process of the mask pattern for the gate mask pattern 74 is performed. Through the reduction process of the mask pattern, the gate mask pattern 74 and the monitor mask patterns 64a to 64c have both the width and the thickness reduced, and are changed to a reduced gate mask pattern 75 and reduced monitor mask patterns 65a to 65c, respectively, as shown in FIG. 9B. The processor 26 calculates a reduced pattern width for reduced monitor mask patterns 65a to 65c, based on the reflected interference spectrum from the reduced monitor mask patterns 65a to 65c in a wavelength range of 400 to 800 nm. The results obtained by the calculation are fed back to an etching control unit (not shown) for controlling the plasma etching. The reduced pattern width is measured at a regular time interval to determine an end point of the plasma etching in the reduction process of the mask pattern, and then, the plasma etching is carried out so that the reduced monitor mask patterns 65a to 65c have the desired pattern width Ws, for example, 70 nm. As a result, the pattern width of the reduced gate mask pattern 75 also has the desired pattern width, i.e., 70 nm. Additionally, each of the reduced monitor mask patterns 65a to 65c has a thickness Ts of 200 nm.

(c) After completion of the reduction process of the mask pattern, the semiconductor substrate 16 is unloaded from the chamber 50 and placed into an RIE apparatus. The conductive film 62 and the insulating film 60 are selectively etched by the RIE using the reduced gate mask pattern 75 and the reduced monitor mask patterns 65a to 65c as an etching mask. After the gate mask pattern 75 and the reduced monitor mask patterns 65a to 65c are removed by a resist stripper or the like, as shown in FIG. 9C, a gate structure composed of a gate electrode 78 and a gate insulating film 76, and a monitor pattern including monitor conductive films 68a to 68c and monitor insulating films 66a to 66c are formed.

When employing the method for fabricating a pattern according to the second embodiment, the reduced pattern width of the reduced monitor mask patterns 65a to 65c can be measured in real time within the chamber 50 even during the plasma etching procedure in the reduction process of the mask pattern. The second embodiment allows the plasma etching apparatus to perform an in-situ adjustment of etching conditions including a time interval suitable for etching, resulting in achieving a desired reduced pattern width with high accuracy. Furthermore, the plasma etching apparatus can control the reduced pattern width without being affected by variations in etching conditions and the like, such as in the case of time management for control of the etching time.
Other Embodiments The present invention has been described as mentioned above. However the descriptions and drawings that constitute a portion of this disclosure should not be perceived as limiting this invention. Various alternative embodiments and operational techniques will become clear to persons skilled in the art from this disclosure.

In the first and second embodiments of the present invention, as a matter of explanatory convenience, a resist pattern used to measure the reflected interference spectrum is made so as to have a periodic L/S configuration. However, needless to say, the resist pattern may be an optional pattern where intervals of the patterns and a mixed ratio of the space occupied by the resist film and the vacuum are determined. In effect, when previously determining the intervals of patterns and the area ratio of patterns and spaces according to layout data for fabricating the resist pattern, the method makes it possible to reduce even complicated patterns without any problems. Furthermore, needless to say, a semiconductor device may be formed as dummy resist patterns to be measured, for example, a simplified L/S configuration shown in FIG. 2, on a region of the semiconductor substrate in which semiconductor elements are not formed.

Additionally, although as an insulating film of the underlying layer, a $SiO_2$ film is used in the description above, it is apparent that other insulating films can be used, for example, including: a silicon nitride ($Si_3N_4$) film; a silicon oxynitride ($SiO_xN_y$) film; a phosphorous-doped or phosphorous/boron-doped silicon oxide (PSG or BPSG) film; a spin-on glass (SOG) film made of silicone resin; a polyimide film; a fluorine-added silicon oxide film; a compound film of organopolysiloxane group; and a compound film of inorganic polysiloxane group.

Additionally, although as a conductive film of the underlying layer, a polysilicon film is used in the description above, needless to say, other conductive films can be employed, for example, including: a metal film made of aluminum (Al), tungsten (W), and the like; a metal silicide film made of tungsten silicide ($WSi_2$), titanium silicide ($TiSi_2$), and the like; and a metal compound film made of metal nitride such as tungsten nitride ($WN_2$), titanium nitride (TiN), and the like.

What is claimed is:

1. A method for fabricating a pattern, comprising:
   delineating a mask pattern on at least a portion of an underlying layer;
   etching a portion of the mask pattern;
   irradiating an incident light on the mask pattern to which the etching is performed and detecting a reflected light produced by reflecting the incident light after the incident light is transmitted through the mask pattern;
   obtaining a reflected interference spectrum; and
   calculating a pattern width of the mask pattern using data of the reflected interference spectrum, the reflected interference spectrum being in a wavelength range of not less than two times a pitch of the mask pattern.

2. The method of claim 1, wherein the etching reduces the pattern width of the mask pattern.

3. The method of claim 1, wherein the calculating of the pattern width is performed by defining a variation in the reflected interference spectrum in numerical terms, the variation being a result of the etching.

4. The method of claim 1, wherein an end point of the etching is determined by calculating the pattern width.

5. The method of claim 1, wherein the etching of the mask pattern is selectively performed with respect to the underlying layer.

6. The method of claim 1, wherein the etching is performed using a plasma.

7. The method of claim 1, wherein the incident light is introduced into a chamber provided to perform the etching and is irradiated on the mask pattern, and the reflected light is reflected from the chamber.

8. The method of claim 1, wherein the reflected and detected light is a polarized light.

9. The method of claim 1, wherein the incident light irradiated on the mask pattern is a light polarized in a direction approximately parallel to a longitudinal direction along the mask pattern.

10. The method of claim 1, wherein the mask pattern is made of a resist film.

11. A method for manufacturing a semiconductor device, comprising:
    forming an underlying layer above a semiconductor substrate;
    delineating a mask pattern on the underlying layer;
    etching a portion of the mask pattern;
    irradiating an incident light on the mask pattern to which the etching is performed and detecting a reflected light produced by reflecting the incident light after the incident light is transmitted through the mask pattern;
    obtaining a reflected interference spectrum;
    calculating a pattern width of the mask pattern using data of the reflected interference spectrum, the reflected interference spectrum being in a wavelength range of not less than two times a pitch of the mask pattern; and
    selectively processing the underlying layer using the mask pattern, the mask pattern being etched to have a desired pattern width.

12. The method of claim 11, wherein the etching reduces the pattern width of the mask pattern.

13. The method of claim 11, wherein the calculating of the pattern width is performed by defining a variation in the reflected interference spectrum in numerical terms, the variation being a result of the etching.

14. The method of claim 11, wherein an end point of the etching is determined by calculating the pattern width.

15. The method of claim 11, wherein the etching of the mask pattern is selectively performed with respect to the underlying layer.

16. The method of claim 11, wherein the etching is performed using a plasma.

17. The method of claim 11, wherein the incident light is introduced into a chamber provided to perform the etching and is irradiated on the mask pattern, and the reflected light is reflected from the chamber.

18. The method of claim 11, wherein the reflected and detected light is a polarized light.

19. The method of claim 11, wherein the incident light irradiated on the mask pattern is a light polarized in a direction approximately parallel to a longitudinal direction along the mask pattern.

20. The method of claim 11, wherein the mask pattern is made of a resist film.

* * * * *